(12) United States Patent
Chen

(10) Patent No.: US 11,854,880 B2
(45) Date of Patent: Dec. 26, 2023

(54) MEMORY DEVICE AND METHOD FOR MANUFACTURING THE SAME

(71) Applicant: CHANGXIN MEMORY TECHNOLOGIES, INC., Hefei (CN)

(72) Inventor: Tao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 184 days.

(21) Appl. No.: 17/411,094

(22) Filed: Aug. 25, 2021

(65) Prior Publication Data

US 2022/0270922 A1   Aug. 25, 2022

Related U.S. Application Data

(63) Continuation of application No. PCT/CN2021/103683, filed on Jun. 30, 2021.

(30) Foreign Application Priority Data

Feb. 25, 2021   (CN) .......................... 202110209896.4

(51) Int. Cl.
*H01L 23/522*  (2006.01)
*H01L 21/768*  (2006.01)
(Continued)

(52) U.S. Cl.
CPC .... *H01L 21/76883* (2013.01); *C23C 14/5873* (2013.01); *H01L 21/28506* (2013.01);
(Continued)

(58) Field of Classification Search
CPC ... H01L 21/285; H01L 21/762; H01L 21/768; H01L 21/3213; H01L 21/28506;
(Continued)

(56) References Cited

U.S. PATENT DOCUMENTS 6,352,896 B1   3/2002  Liu
10,607,996 B1  3/2020  Sasaki
(Continued)

FOREIGN PATENT DOCUMENTS

CN   1925161 A   3/2007
CN   1983566 A   6/2007
(Continued)

OTHER PUBLICATIONS

First Office Action of the Chinese application No. 202110209896.4, dated Jun. 6, 2022, 16 pgs.

*Primary Examiner* — Chuong A Luu
(74) *Attorney, Agent, or Firm* — Cooper Legal Group, LLC

(57) ABSTRACT

This application relates to a memory device and a method for manufacturing the same, including: a substrate on which an insulation structure and a plurality of first active structures are formed is provided. The plurality of first active structures are arranged at intervals in the insulation structure. A word line conductive layer is formed on the substrate by a physical vapor deposition process. The word line conductive layer is patterned and etched to obtain a plurality of word line structures arranged in parallel and at intervals and filling slots located between adjacent word line structures. The filling slots comprise first filling slots that expose both parts of top surfaces of the first active structures and parts of the top surface of the insulation structure. Second active structures are formed in the first filling slots, and isolation structures are formed in the first filling slots.

20 Claims, 14 Drawing Sheets

(51) Int. Cl.
  *H01L 21/3213* (2006.01)
  *C23C 14/58* (2006.01)
  *H01L 21/762* (2006.01)
  *H01L 21/285* (2006.01)

(52) U.S. Cl.
  CPC .... *H01L 21/3213* (2013.01); *H01L 21/76224* (2013.01); *H01L 23/5226* (2013.01)

(58) Field of Classification Search
  CPC ......... H01L 21/76224; H01L 21/76883; H01L 23/522; H01L 23/5226; H10B 12/00; H10B 12/488
  USPC ........................................................ 438/643
  See application file for complete search history.

(56) References Cited

U.S. PATENT DOCUMENTS

| | | | | |
|---|---|---|---|---|
| 2017/0229204 | A1* | 8/2017 | Fletcher | G21K 1/02 |
| 2019/0019795 | A1 | 1/2019 | Takesako et al. | |
| 2019/0295946 | A1* | 9/2019 | Saino | H01L 23/5226 |
| 2019/0355615 | A1* | 11/2019 | Shu | H01L 21/02282 |
| 2020/0212043 | A1 | 7/2020 | Sasaki | |
| 2021/0184055 | A1* | 6/2021 | Chen | H01L 28/20 |
| 2021/0202325 | A1* | 7/2021 | Lee | H01L 29/66545 |
| 2021/0295946 | A1* | 9/2021 | Kinney | G16B 50/30 |

FOREIGN PATENT DOCUMENTS

| | | |
|---|---|---|
| CN | 1983601 A | 6/2007 |
| CN | 102683291 A | 9/2012 |
| CN | 204130533 U | 1/2015 |
| CN | 104465496 A | 3/2015 |
| CN | 102956466 B | 11/2016 |
| CN | 106847754 A | 6/2017 |
| CN | 107431071 A | 12/2017 |
| CN | 108831884 A | 11/2018 |
| CN | 208127209 U | 11/2018 |
| CN | 108933136 A | 12/2018 |
| CN | 110957319 A | 4/2020 |
| CN | 111223860 A | 6/2020 |
| CN | 111430348 A | 7/2020 |
| CN | 112038340 A | 12/2020 |
| CN | 113035775 A | 6/2021 |

* cited by examiner

MEMORY DEVICE AND METHOD FOR MANUFACTURING THE SAME

CROSS-REFERENCE TO RELATED APPLICATION

This application is a continuation of International Application No. PCT/CN2021/103683, filed on Jun. 30, 2021, which claims priority to Chinese patent application No. 202110209896.4, filed to the China National Intellectual Property Administration on Feb. 25, 2021 and entitled "Memory Device and Method for Manufacturing the same". The disclosures of International Application No. PCT/CN2021/103683 and Chinese patent application No. 202110209896.4 are hereby incorporated by reference in their entireties.

TECHNICAL FIELD

This application relates to the technical field of semiconductors, and in particular to a memory device and a method for manufacturing the same.

BACKGROUND

In a traditional technology for manufacturing a memory device, steps for forming a word line structure includes the following operations: in the first step, a Word Line (WL) trench is etched after an Active Area (AA) and a Slot Trench Isolation (STI) are formed on a substrate; in the second step, after a metal tungsten film is formed on the substrate through a Chemical Vapor Deposition (CVD) process to fill the WL trench, the excess metal tungsten film is removed by performing an etching process, to obtain a word line structure composed of the remaining metal tungsten film. However, the word line structure obtained through the method has the problem of poor conductive performance, which affects the performance of the memory device.

SUMMARY

Based on this, for the problem of poor conductive performance, which affects the performance of the memory device, it is necessary to provide a memory device and a method for manufacturing the same.

A method for manufacturing a memory device includes the following operations.

A substrate on which an insulation structure and a plurality of first active structures are formed is provided, the plurality of first active structures are arranged at intervals in the insulation structure.

A word line conductive layer is formed on the substrate by a physical vapor deposition process, a top surface of the word line conductive layer is higher than top surfaces of the first active structures.

The word line conductive layer is patterned and etched to obtain a plurality of word line structures arranged in parallel and at intervals and filling slots located between adjacent word line structures, the filling slots include first filling slots that expose both parts of the top surfaces of the first active structures and parts of the top surface of the insolation structure.

Second active structures that extend from exposed top surfaces of the first active structures to the top surfaces of the word line structures are formed in the first filling slots.

Isolation structures that extend from exposed top surface of the insulation structure to the top surfaces of the word line structures are formed in the first filling slots.

A memory device is manufactured through any one of the above methods.

BRIEF DESCRIPTION OF THE DRAWINGS

To better clarity the technical solution of the embodiments of this application or the traditional technology, the drawings required to illustrate the embodiments or the traditional technology will be simply described blow. It is apparent that the drawings described below merely illustrate some embodiments of this application. Those ordinarily skilled in the art can obtain other drawings without creative labor on the basis of those drawings.

DESCRIPTION OF REFERENCE SIGNS

Figure 1:
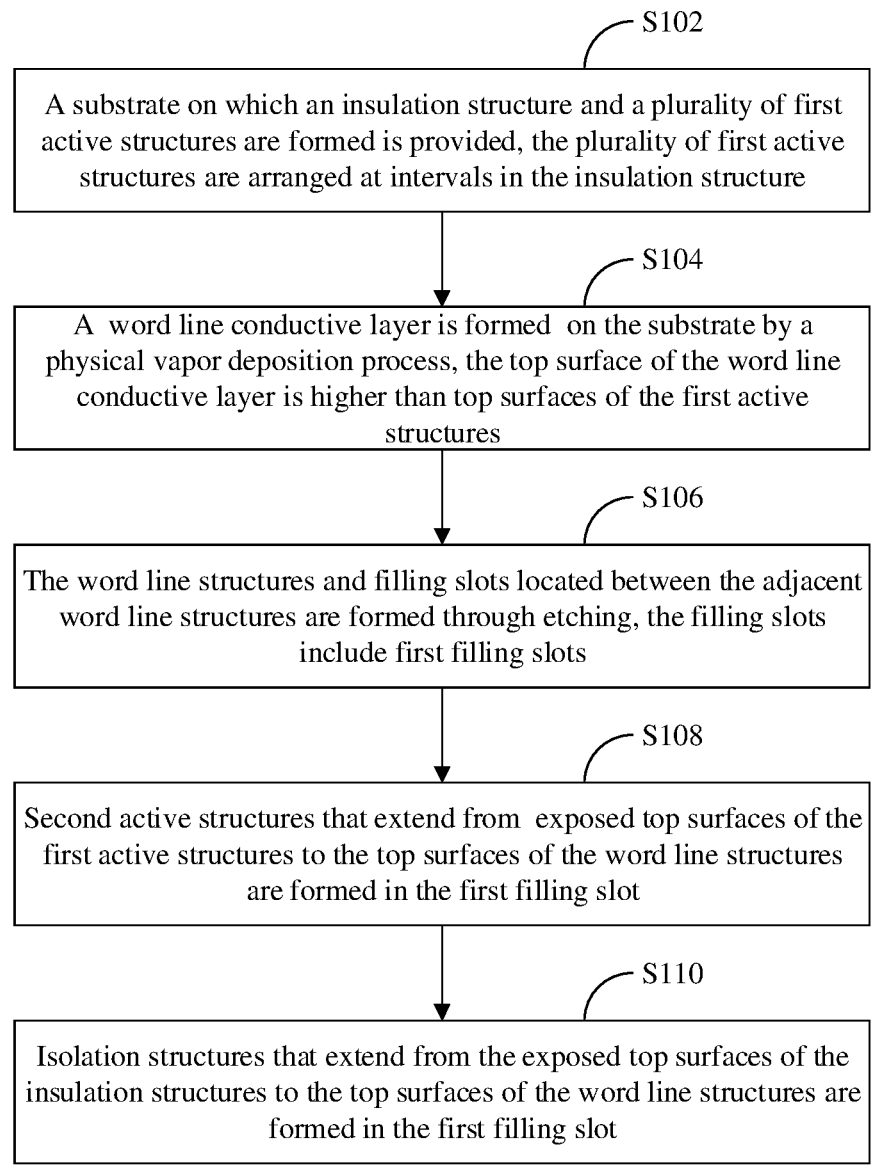
FIG. 1 is a flow schematic diagram of a method for manufacturing a memory device according to one embodiment.

102: Substrate; 202: Insulation structure; 204: Active trench; 206: First active structure; 304: Second conductive layer; 402: First inter-gate insulation layer; 404: First conductive layer; 502: Second conductive structure; 504: Second filling slot; 506: First filling slot; 508: Top surface of the first active structure; 510: Top surface of the insulation structure; 512: Top surface of the first active structure; 602: First inter-gate insulation structure; 604: First conductive structure; 606: Second inter-gate insulation structure; 608: Third conductive structure; 610: Second active structure; 612: Third active structure, 614: Isolation structure.

DETAILED DESCRIPTION

In order to facilitate the understanding of this application, this application will be described more comprehensively below with reference to the related drawings. The preferred embodiment of the application is shown in the accompanying drawings. However, this application can be implemented in many different forms and is not limited to the embodiments described herein. On the contrary, the purpose of providing these embodiments is to make the disclosure of this application more thorough and comprehensive.

Unless otherwise defined, all technical and scientific terms used herein have the same meanings as commonly understood by those skilled in the technical field of this application. Herein, terms used in the description of this application are only for the purpose of describing specific embodiments and not intended to limit this application.

It should be understood that when an element or layer is referred to as "on", "adjacent to", "connected to", or "coupled to" other elements or layers, it may be directly on, adjacent to, connected to or coupled to the other elements or layers, or intervening elements or layers may be present. On the contrary, when an element is referred to as being "directly on", "directly adjacent to" or "directly connected to" or "directly coupled to" other elements or layers, there is no intermediate element or layer. It should be understood that, although various elements, components, regions, layers, doping types and/or parts may be described with terms first, second, third, etc., these elements, components, regions, layers, doping types and/or parts should not be limited by these terms. These terms are used only to distinguish one element, component, region, layer, doped layer or part from another element, component, region, layer, doping type or part. Therefore, a first element, component, region, layer, doping type or part discussed below may be represented as a second element, component, region, layer or part without departing from the teachings of the present application. For example, a first doping type may become a second doping type, and similarly a second doping type may become a first doping type. The first doping type and the second doping type are different doping types. For example, the first doping type may be type-P and the second doping type may be type-N, or the first doping type may be type-N and the second doping type may be type-P.

Spatially relational terms such as "below", "under", "lower", "beneath", "above", and "upper" may be used herein to describe a relationship between one element or feature and another element or feature illustrated in the figures. It should be understood that, in addition to the orientation shown in the figures, the spatially relational terms further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may be otherwise oriented (rotated by 90 degrees or in other orientations) and the spatial descriptors used herein may be interpreted accordingly.

As used herein, singular forms "a/an", "one", and "the" may also include the plural forms, unless otherwise specified in the context. It should be also understood that, when terms "composed of" and/or "including" are used in this description, the presence of the features, integers, steps, operations, elements, and/or components is determined, but the presence or addition of one or more other features, integers, steps, operations, elements, components, and/or groups is also possible. As used herein, term "and/or" includes any and all combinations of the related listed items.

Embodiments of this application are described with reference to a section diagram of a schematic diagram of a ideal embodiment (and a middle structure) of this application, so that changes in the shape shown due to, for example, manufacturing technology and/or tolerances can be expected. Therefore, the embodiments of this application should not be limited to a specific shape of a region herein, but include a shape deviation caused by the manufacturing technology. For example, an injection region shown as a rectangle usually has a circular or bending feature and/or an injection concentration gradient at an edge of the injection region instead of a binary change from the injection region to a non-injection region. Similarly, the buried region formed by the implantation can result in some implantation in the region between the buried region and the surface through which the implantation proceeds. Therefore, the regions shown in the figures are essentially schematic, their shapes do not represent actual shapes of the regions of device, and do not limit the scope of this application.

In a typical process for manufacturing a memory device, a word line trench is etched after an active area and an isolation structure are formed. After a tungsten metal film is formed through CVD, Rapid Thermal Annealing (RTA) is performed. After the tungsten metal film is patterned and etched, a word line structure composed of the remaining tungsten metal film in the word line trench is obtained. At this time, a halogen element existing in the word line structure may affect the conductivity of the word line structure, thereby affecting the performance of the memory device.

Referring to FIG. 1, FIG. 1 is a flow schematic diagram of a method for manufacturing a memory device according to one embodiment.

In order to solve the abovementioned problem, the present application provides a method for manufacturing a memory device. As shown in FIG. 1, the method includes the following operations.

At S102, a substrate is provided, an insulation structure and a plurality of first active structures are formed on the substrate, and the plurality of first active structures are arranged at intervals in the insulation structure.

The substrate is provided, the insulation structure and the plurality of first active structures are formed on the substrate, and the plurality of first active structures are arranged at intervals in the insulation structure. It should be understood that the first active structures are silicon active structures and the insulation structure is silicon dioxide structure.

The substrate may be formed of un-doped monocrystalline silicone, monocrystalline silicone doped with impurities, Silicon On Insulator (SOI), Superimposed Silicon On Insulator (SSOI), Superimposed Silicon Germanium On Insulator (S-SiGeOI), Silicon Germanium On Insulator (SiGeOI) and Germanium On Insulator (GeOI), etc. For example, in this embodiment, the material for composing the substrate is the monocrystalline silicone.

At S104, a word line conductive layer is formed on the substrate by a physical vapor deposition process. The top surface of the word line conductive layer is higher than the top surfaces of the first active structures.

The word line conductive layer is formed on the substrate by the physical vapor deposition process. The word line conductive layer covers the first active structures and the insulation structure, and the top surface of the word line conductive layer is higher than the top surfaces of the first active structures and the top surface of the insulation structure. Compared with the chemical vapor deposition, the influence of the halogen element in the process gas on the conductive performance of the word line conductive layer may be avoided during a process of forming the word line conductive layer.

At S106, the word line structures and filling slots located between the adjacent word line structures are formed through etching, and the filling slots include first filling slots.

The word line conductive layer is patterned and etched to obtain a plurality of word line structures arranged in parallel and at intervals and the filling slots located between the adjacent word line structures. The filling slots include the first filling slots that expose both parts of top surfaces of the first active structures and parts of top surfaces of the insulation structures. Namely, after mask patterns are formed on the word line conductive layer through a photo-etching process, a part of the word line conductive layer (excess word line conductive layer) which is not covered by the mask patterns is etched and removed by an etching process, to obtain the plurality of word line structures which are arranged in parallel and at intervals and the filling slots located between the adjacent word line structures, the plurality of word line structures are composed of a part of the word line conductive layer which is covered by the mask patterns (remaining word line conductive layers). The filling slots include the first filling slots, each first filling slot is formed between a word line structure on the first active structure and a word line structure on the insulation structure and exposes a part of a top surface of a first active structure, a part of the top surface of the insulation structure and a junction of the first active structure and the insulation structure at the same time.

At S108, second active structures that extend from the exposed top surfaces of the first active structures to the top surfaces of the word line structures are formed in the first filling slots.

The second active structures that extend from the exposed top surfaces of the first active structures to the top surfaces of the word line structures are formed in the first filling slot That is, the second active structures are formed in the first filling slots, the bottom of each second active structure is coincided with a top surface, that is exposed in a first filling slot, of a first active structure and the second active structure contacts with the first active structure as the active area of the memory device.

At S110, isolation structures that extend from the exposed top surface of the insulation structure to the top surfaces of the word line structures are formed in the first filling slots.

The isolation structures that extend from the exposed top surface of the insulation structure to the top surfaces of the word line structures are formed in the first filling slots. That is, an isolation structure is formed by filling a part of a first filling slot in which no second active structure is formed, the bottom of the isolation structure is coincided with the top surface, that is exposed in the first filling slot, of the insulation structure.

According to the method for manufacturing the memory device, firstly, a word line conductive layer is formed on the substrate through a physical vapor deposition process, a top surface of the word line conductive layer is higher than top surfaces of the first active structures formed on the substrate. Secondly, a plurality of word line structures arranged in parallel and at intervals and the filling slots located between the adjacent word line structures are obtained by patterning and etching the word line conductive layer, the filling slots include first filling slots that expose both parts of the top surfaces of the first active structures and parts of the top surface of the insulation structure. And then, second active structures that extend from the exposed top surfaces of the first active structures to the top surfaces of the word line structures are formed in the first filling slots, and isolation structures that extend from the exposed top surface of the insulation structure to the top surfaces of the word line structures are formed in the first filling slots. Compared with a manner that the active area including the first active structures and the second active structures and the isolation structure are firstly formed, and then the word line structures are formed through slotting and filling, the word line structures in the memory device of the present application are formed in a manner that the excess word line conductive layer is removed through etching after the word line conductive layer is formed through the physical vapor deposition process, the halogen elements and the cavities do not exist in the word line structures, so the conductive performance of the word line structure and the performance of the memory device may be improved.

In one embodiment, the bottom surface of the word line conductive layer is flush with the top surfaces of the first active structures. In another embodiment, the bottom surface of the word line conductive layer is higher than the top surfaces of the first active structures.

Figure 2:
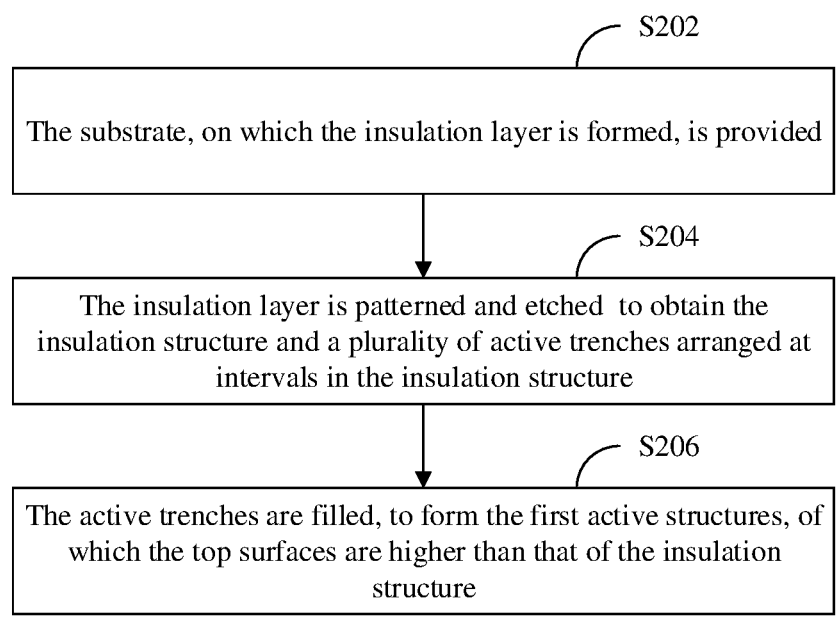
FIG. 2 is a flow schematic diagram of S102 according to one embodiment.
Figure 3:
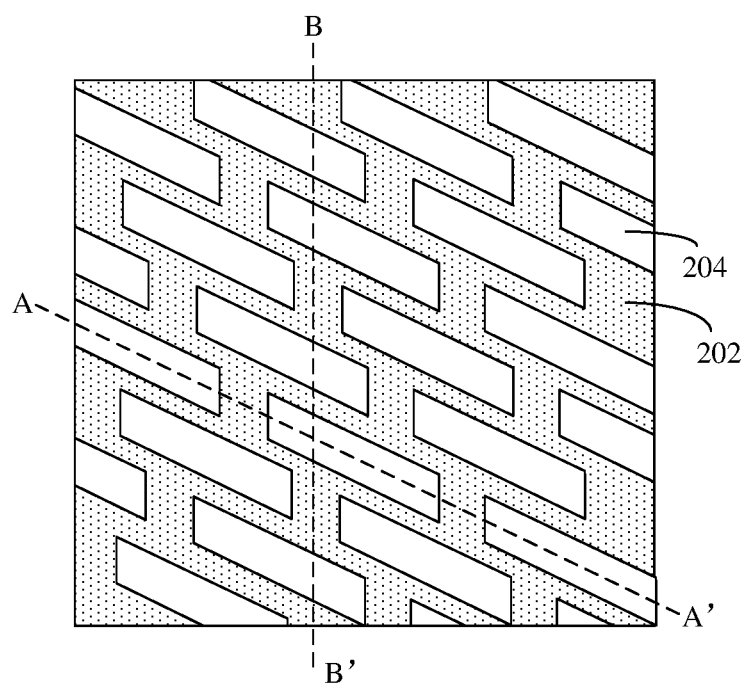
FIG. 3 is a schematic diagram of a top view of a memory device after S204 according to one embodiment.
Figure 4A:
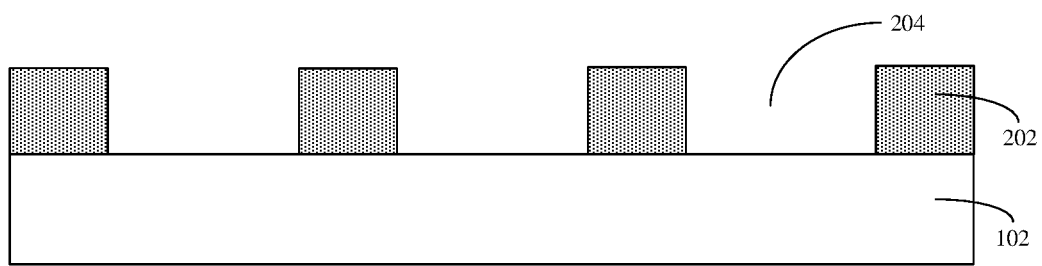
FIG. 4a is a sectional schematic diagram of a memory device as shown in FIG. 3 along an AA' direction.
Figure 4B:
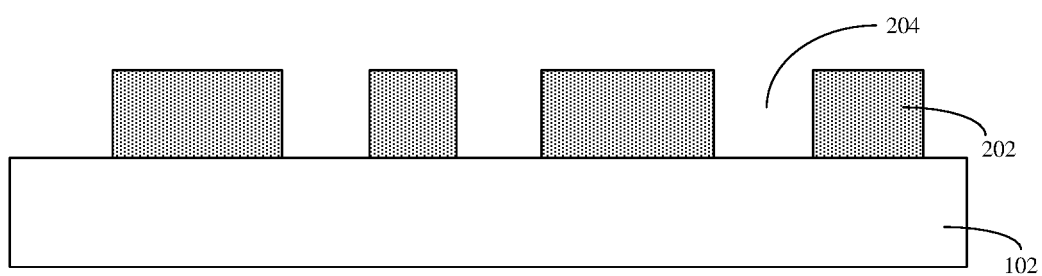
FIG. 4b is a sectional schematic diagram of a memory device as shown in FIG. 3 along a BB' direction.
Figure 5A:
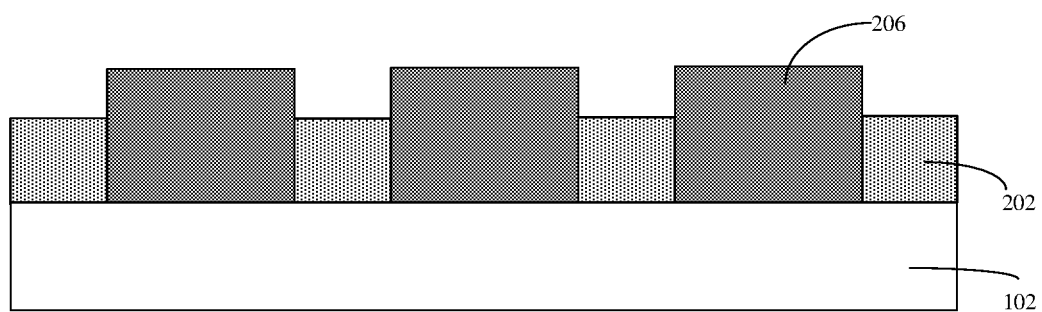
FIG. 5a is a sectional schematic diagram of a memory device along an AA' direction after a first active structure is formed, according to one embodiment.
Figure 5B:
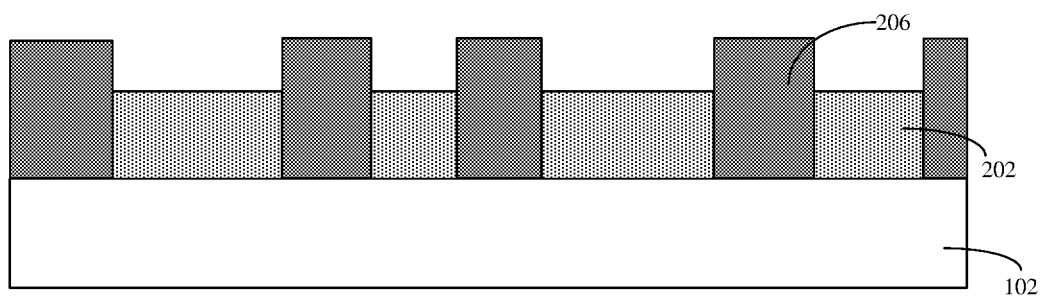
FIG. 5b is a sectional schematic diagram of a memory device corresponding to FIG. 5a along a BB' direction.

Referring to FIG. 2, FIG. 2 is a flow schematic diagram of S102 according to one embodiment. Referring to FIG. 3, FIG. 3 is a schematic diagram of a top view of a memory device after S204 according to one embodiment. Referring to FIG. 4a, FIG. 4a is a sectional schematic diagram of a memory device as shown in FIG. 3 along an AA' direction. Referring to FIG. 4b, FIG. 4b is a sectional schematic diagram of a memory device as shown in FIG. 3 along a BB' direction. Referring to FIG. 5a, FIG. 5a is a sectional schematic diagram of a memory device along an AA' direction after the first active structure is formed according to one embodiment. Referring to FIG. 5b, FIG. 5b is a sectional schematic diagram of a memory device corresponding to FIG. 5a along a BB' direction.

As shown in FIG. 2 to FIG. 5b, in one embodiment, the bottom surface, which is located at the top surface of the insulation structure, of the word line conductive layer is lower than the top surfaces of the first active structures. Operation S102 includes the following operations.

At S202, the substrate, on which the insulation layer is formed, is provided.

At S204, the insulation layer is patterned and etched to obtain the insulation structure and a plurality of active trenches arranged at intervals in the insulation structure.

The excess insulation layer on the substrate 102 is removed through patterning and etching so as to obtain the insulation structure 202 and the plurality of active trenches 204 arranged at intervals in the insulation structure.

As shown in FIG. 4a and FIG. 4b, specifically, the mask patterns that cover a part of the insulation layer to be reserved are firstly formed on the substrate 102. That is, the mask patterns expose a part of the insulation layer where the first active structures are subsequently formed. And then, a part of the insulation layer that is not covered by the mask pattern is removed through etching, so as to obtain the insulation structure 202 composed of the remaining insulation layer and the plurality of active trenches 204 arranged at intervals in the insulation structure 202.

In one embodiment, the insulation layer with a certain thickness is provided between the bottom of the active trench 204 and the upper surface of the substrate 102.

At S206, the active trenches are filled, to form the first active structures of which the top surfaces are higher than the top surface of the insulation structure.

An active trench 204 is filled to form a first active structure 206 of which the top surface is higher than the top surface of a insulation structure 202. Specifically, the first active structure 206 is formed by filling the active trench 204, the top surface of the first active structure 206 are higher than the top surface of the insulation structure 202.

In another embodiment, the top surfaces of the first active structures are flush with the top surface of the insulation structure 202, or the top surfaces of the first active structures 206 are lower than the top surface of the insulation structure 202.

As shown in FIG. 4a, FIG. 4b, FIG. 5a and FIG. 5b, in an embodiment, the operation that the active trenches 204 which expose the upper surface of the substrate 102 are filled to form the first active structures 206 of which the top surfaces are higher than the insulation structure 202 includes the following operation.

The first active structures 206 are formed in the active trenches 204 by an epitaxial process. The first active structures 206 are silicon epitaxial structures, and the first active structures 206 formed through the epitaxial process are monocrystalline silicon structures, so that the problem of unmatched lattice between the first active structures 206 and the substrate 102 is avoided.

In one embodiment, the first active structures may be formed by another manner for forming the silicon active structure which is well-known by those skilled in the art.

Figure 6:
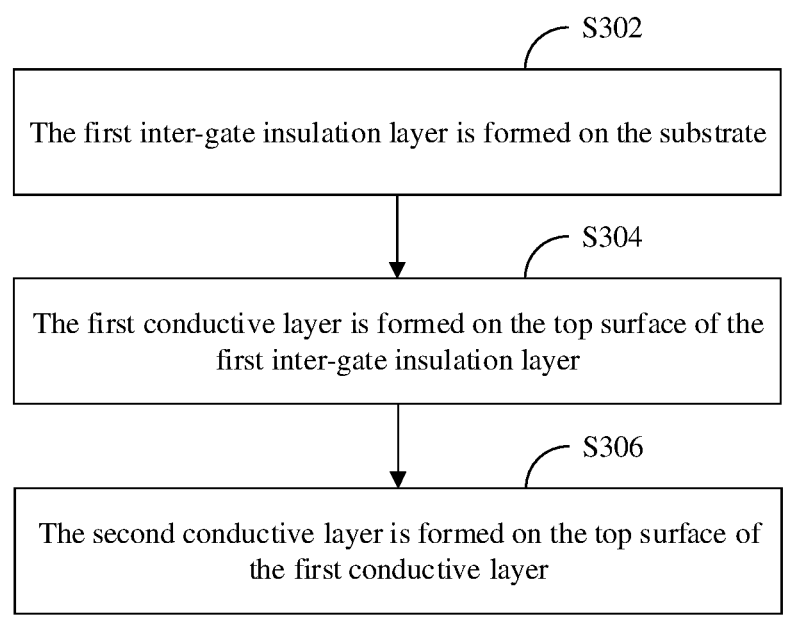
FIG. 6 is a flow schematic diagram for forming a word line conductive layer on a substrate according to one embodiment.
Figure 7A:
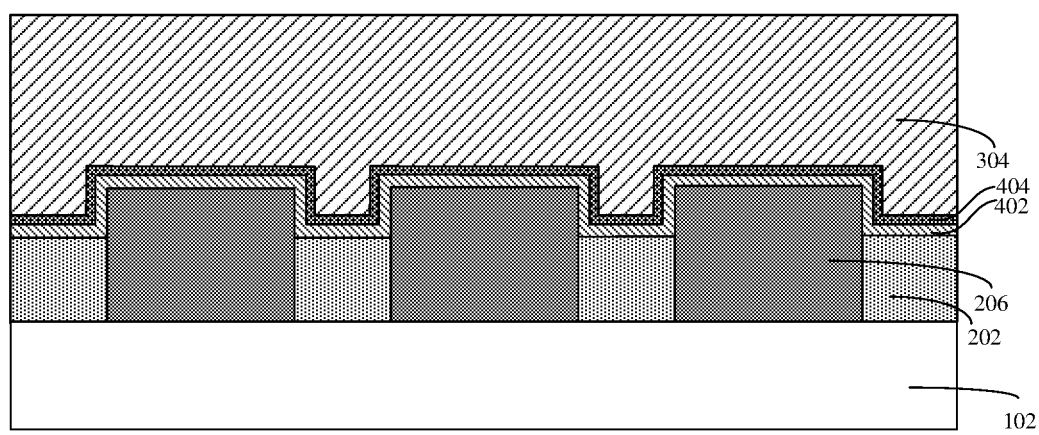
FIG. 7a is a sectional schematic diagram of a memory device along an AA' direction after a word line conductive layer is formed, according to one embodiment.
Figure 7B:
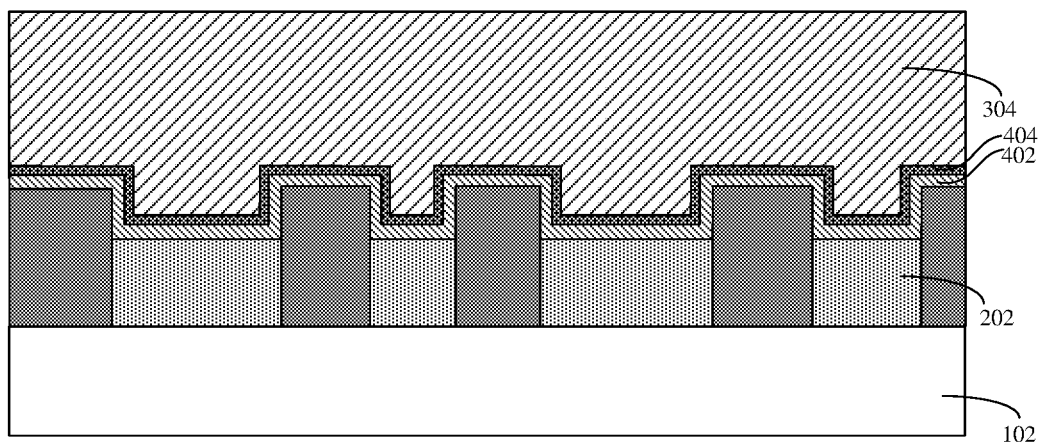
FIG. 7b is a sectional schematic diagram of a memory device corresponding to FIG. 7a along a BB' direction.

Referring to FIG. 6, FIG. 6 is flow schematic diagram for forming a word line conductive layer on a substrate according to one embodiment. Referring to FIG. 7a, FIG. 7a is a sectional schematic diagram of a memory device along an AA' direction after a word line conductive layer is formed according to one embodiment. Referring to FIG. 7b, FIG. 7b is sectional schematic diagram of a memory device corresponding to FIG. 7a along a BB' direction.

As shown in FIG. 6, FIG. 7a and FIG. 7b, in one embodiment, the operation of forming the word line conductive layer on the substrate 102 includes the following operations.

At S302, the first inter-gate insulation layer is formed on the substrate.

The first inter-gate insulation layer 402 is formed on the substrate 102, and the first inter-gate insulation layer 402 covers the top surfaces of the first active structures 206 and the top surface of the insulation structure 202. Specifically, as shown in FIG. 7a and FIG. 7b, the first inter-gate insulation layer 402 is formed on the upper surfaces of the first active structures 206, and the first inter-gate insulation layer 402 extends along the top surfaces of the first active structures 206 and covers the top surface of the insulation structure 202. In this embodiment, the first inter-gate insulation layer 402 at least includes any one of silicon dioxide film and high-k gate dielectric film, and the first inter-gate insulation layer 402 may be formed through an atomic layer deposition process or another process.

At S304, the first conductive layer is formed on the top surface of the first inter-gate insulation layer.

The first conductive layer 404, such as a Titanium/Titanium Nitride (Ti/TiN) metal layer, is formed on the top surface of the first inter-gate insulation layer 402.

At S306, the second conductive layer is formed on the top surface of the first conductive layer.

The second conductive layer 304 is formed on the top surface of the first conductive layer 404, and the word line conductive layer is composed of the first inter-gate insulation layer 402, the first conductive layer 404 and the second conductive layer 304.

In one embodiment, the second conductive layer 304 includes a tungsten conductive layer. When the first inter-gate insulation layer 402 is a silicon dioxide layer, the first conductive layer 404 is a titanium nitride metal layer and the second conductive layer 304 is the tungsten conductive layer, the operation of forming the second conductive layer 304 on the first conductive layer 404 includes the following operations: the tungsten conductive layer is formed on the upper surface of the titanium nitride metal layer, at this time, the titanium nitride metal layer is used as an adhesive layer. In this embodiment, the lower surface of the second conductive layer 304 is lower than the upper surface of the first active structure 206.

In one embodiment, operation S306 includes the following operations: in a first step, the second conductive layer material is formed on the first conductive layer 404; in a second step, the second conductive layer material is flattened to obtain the second conductive layer 304. For example, the second conductive layer material is flattened by a chemical polishing process, to obtain the second conductive layer 304 composed of the remaining second conductive layer material.

Figure 8A:
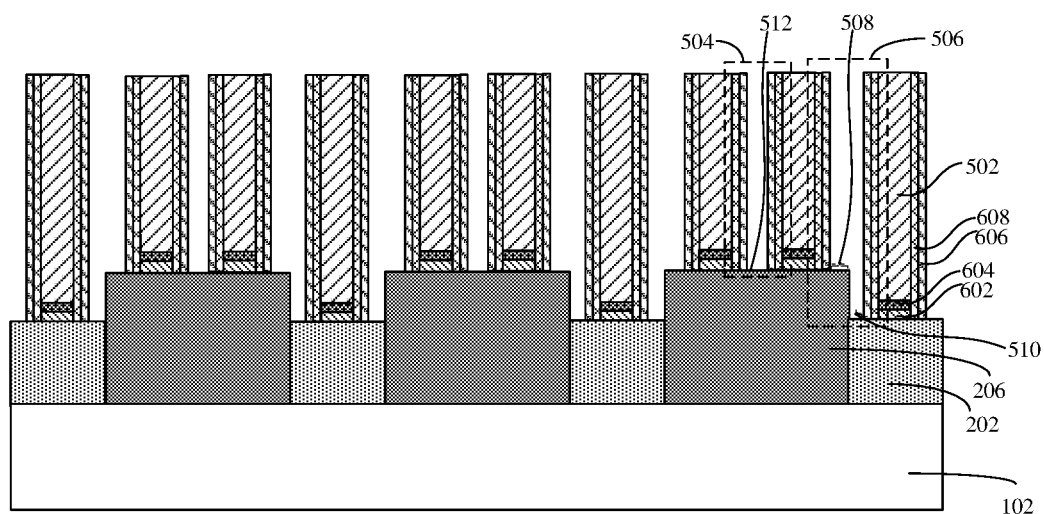
FIG. 8a is a sectional schematic diagram of a memory device along an AA' direction after a word line structure is formed, according to one embodiment.
Figure 8B:
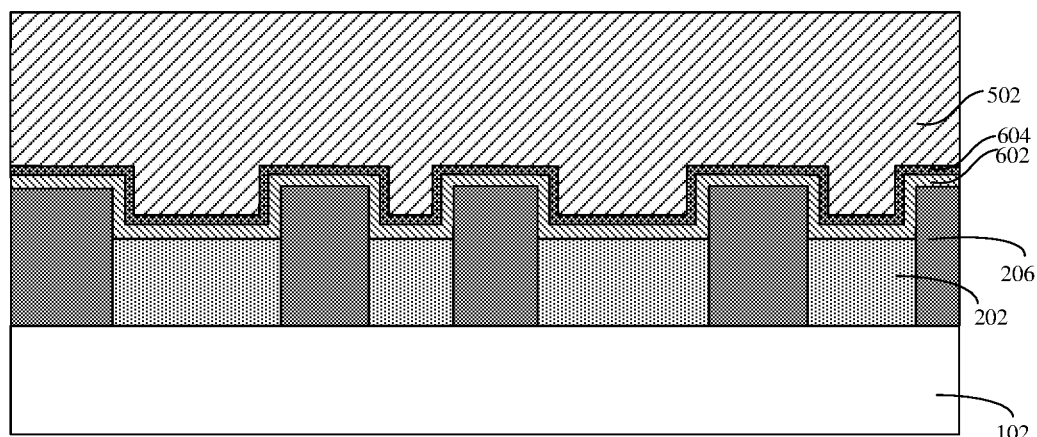
FIG. 8b is a sectional schematic diagram of a memory device corresponding to FIG. 8a along a BB' direction.

Referring to FIG. 8a, FIG. 8a is a sectional schematic diagram of a memory device along an AA' direction after word line structures are formed according to one embodiment. Referring to FIG. 8b, FIG. 8b is a sectional schematic diagram of a memory device corresponding to FIG. 8a along a BB' direction.

As shown in FIG. 8a and FIG. 8b, in one embodiment, the operation of patterning and etching the word line conductive layer to obtain the plurality of word line structures arranged in parallel and at intervals includes the following operation.

The second conductive layer 304, the first conductive layer 404 and the first inter-gate insulation layer 402 are patterned and etched, to obtain the word line structures each including a second conductive structure 502, a first conductive structure 604 and a first inter-gate insulation structure 602 that are successively superposed.

Specifically, the word line mask patterns are formed on the substrate 102. The word line mask patterns cover a part of the second conductive layer 304 that is needed to be reserved and expose a part of the second conductive layer 304 that is needed to be removed. the second conductive layer 304 as well as the first conductive layer 404 and the first inter-gate insulation layer 402 below the second conductive layer 304 exposed by the word line mask patterns are removed through etching, to obtain the word line structures each including the second conductive structure 502 (the remaining second conductive layer 304), the first conductive structure 604 (the remaining first conductive layer 404) and the first inter-gate insulation structure 602 (the remaining first inter-gate insulation layer 402) that are successively superposed.

In one embodiment, the second conductive structure 502 includes a tungsten conductive structure, the first conductive structure 604 includes a titanium nitride structure, and the first inter-gate insulation structure 602 includes a silicon oxide structure.

In one embodiment, after the word line structures each including the second conductive structure 502, the first conductive structure 604 and the first inter-gate insulation structure 602 that are successively superposed are obtained, the following operations are also included.

A third conductive structure 608 and a second inter-gate insulation structure 606 are successively formed on the side walls of each word line structure. Herein, both the extending direction of the third conductive structure 608 and the extending direction of the second inter-gate insulation structure 606 are the same as that of the word line structure, both the height of the third conductive structure 608 and the height of the second inter-gate insulation structure 606 are equal to the distance between the bottom surface of the word line structure to the top surface of the word line structure, and a gate word line of the memory device includes the word line structure, the third conductive structure 608 and the second inter-gate insulation structure 606. The third conductive structure 608 and the second inter-gate insulation structure 606 are successively superposed from the word line structure toward the filling slot, namely, the distance between the second inter-gate insulation structure 606 to the word line structure is greater than the distance between the third conductive structure 608 to the word line structure.

Specifically, the operation of successively forming the third conductive structure 608 and the second inter-gate insulation structure 606 on the side walls of the word line structures includes the following operations: in the first step, the third conductive structure 608 is formed at the sides of the word line structure (i.e., the side walls of the filling slots at the two sides of the word line structure). Herein, the extending direction of the third conductive structure 608 is the same as that of the word line structure, and the height of the third conductive structure 608 (the distance between the bottom surface, closing to the substrate 102, of the third conductive structure 608 and the top surface away from the substrate 102, of third conductive structure 608, namely, the distance between the bottom wall of the filling slot and the opening of the filling slot) is equal to the distance between the bottom surface of the word line structure and the top surface of the word line structure, in the second step, the second inter-gate insulation structure 606 is formed at the side of the third conductive structure 608. Herein, the extending direction of the second inter-gate insulation structure 606 is the same as that of the word line structure, and the height of the second inter-gate insulation structure 606 (the distance between the bottom surface, closing to the substrate 102, of the second inter-gate insulation structure 606 and the top surface, away from the substrate 102, of the second inter-gate insulation structure 606, namely, the distance between the bottom wall of the filling slot and the opening of the filling slot) is equal to the distance between the bottom surface of the word line structures and the top surface of the word line structure.

In one embodiment, the first inter-gate insulation structure 602 and the second inter-gate insulation structure 606 are composed of a same material, such as, the silicon dioxide gate dielectric layer or the high-k gate dielectric film. The first conductive structure 604 and the third conductive structure 608 are composed of a same material, such as, the titanium nitride metal structure.

In one embodiment, the third conductive structure 608 includes the titanium nitride structure, the second inter-gate insulation structure 606 includes the silicon oxide structure, the word line structures include embedding word line structures, both the top surface of the second active structure and the top surface of the isolation structure are higher the those of the word line structures.

In one embodiment, the first inter-gate insulation structure 602 and the second inter-gate insulation structure 606 together form a gate dielectric structure of the memory device.

Figure 9A:
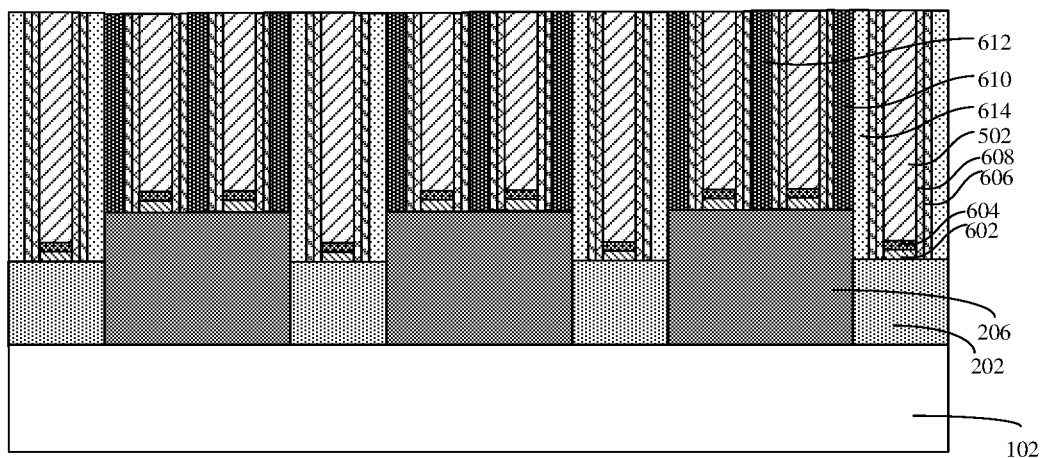
FIG. 9a is a sectional schematic diagram of a memory device along an AA' direction after an isolation structure is formed, according to one embodiment.

Referring to FIG. 9a, FIG. 9a is sectional schematic diagram of a memory device along an AA' direction after the isolation structure is formed according to one embodiment.

Figure 9B:
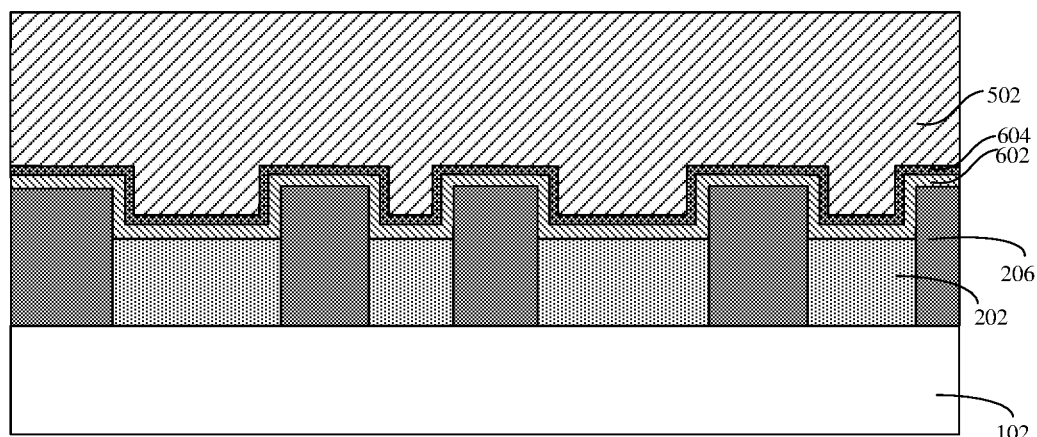
FIG. 9b is a sectional schematic diagram of a memory device corresponding to FIG. 9a along a BB' direction.

Referring to FIG. 9b, FIG. 9a is a sectional schematic diagram of a memory device corresponding to FIG. 9a along a BB' direction.

As shown in FIG. 8a, FIG. 9a and FIG. 9b, in one embodiment, the filling slots further include second filling slots 504 exposing parts of the top surfaces of the first active structures 206.

While the second active structures 610 that extend from the exposed top surface 508 of the first active structures 206 to the top surfaces of the word line structures are formed in the first filling slot 506, the following operations are further included.

A third active structures 612 that extend from the exposed top surfaces 512 of the first active structures 206 to the top surfaces of the word line structures are formed in the second filling slots 504.

Herein, the first active structures 206, the second active structures 610 and the third active structures 612 together form the active areas of the memory device.

In one embodiment, the top surfaces of the second active structures 610 are flush with that of the third active structures 612.

In one embodiment, the top surfaces of the second active structures 610, the top surfaces of the third active structures 612 and the top surfaces of the word line structures are flush with each other.

Specifically, as shown in FIG. 9a, a first active structure 206, a second active structure 610 and a third active structure 612 are a whole silicon active structure. A source structure of a transistor in the memory device is subsequently formed in a second active structure 610, and a drain structure of the transistor in the memory device is formed in a third active structure 612. The memory device includes a transistor with a double word line structure and a common drain structure.

In one embodiment, the third active structures 612 and the second active structures 610 are formed in a same process.

In one embodiment, the operation of forming the third active structures 612 that extend from the exposed top surfaces of the first active structures 206 to the top surfaces of the word line structures in the second filling slots 504 includes the following operation.

The third active structures 612 that extend from the exposed top surfaces of the first active structures 206 to the top surfaces of the word line structures are formed in the second filling slots 504 by the epitaxial process.

In one embodiment, the second active structures 610 at the two sides of a word line structure are respectively used to form the source structure and the drain structure of the transistor in the memory device.

In one embodiment, the operation of forming the second active structures 610 that extends from the exposed top surfaces of the first active structures 206 to the top surfaces of the word line structures in the first filling slots 506 includes the following operation.

The second active structures 610 that extend from the exposed top surfaces of the first active structures 206 to the top surfaces of the word line structures are formed in the first filling slots 506 by the epitaxial process.

In one embodiment, the first active structures 206 and the second active structures 610 together form the active areas of the memory device. In operation S101, the insulation structures 614 that extend from the exposed top surface 510 of the insulation structure 202 to the top surfaces of the word line structures are formed in the first filling slots 506. The insulation structures 614 and the insulation structure 202 together form a Slot Trench Isolation structure.

This application further provides a memory component, which is manufactured through any one of the abovementioned methods.

This application further provides a memory device, which includes the abovementioned memory component.

According to the method for manufacturing the memory device, firstly, a word line conductive layer is formed on the substrate through a physical vapor deposition process, and a top surface of the word line conductive layer is higher than top surfaces of first active structures formed on the substrate. Secondly, the word line conductive layer is patterned and etched to obtain a plurality of word line structures arranged in parallel and at intervals and the filling slots located between adjacent word line structures, and the filling slots include first filling slots that expose both parts of top surfaces of the first active structures and parts of the top surface of the insulation structure. And then, second active structures that extend from exposed top surfaces of the first active structures to the top surfaces of the word line structures are formed in the first filling slots, and isolation structures that extend from exposed top surface of the insulation structure to the top surfaces of the word line structures are formed in the first filling slots. Compared with a manner that the active area including the first active structures and the second active structure and the isolation structure are firstly formed, and then the word line structures are formed through slotting and filling, the word line structures in the memory device according to the present application are formed in a manner that the excess word line conductive layer is removed through etching after the word line conductive layer is formed through the physical vapor deposition process. Halogen elements and cavities do not exist in the word line structures, so that the conductive performance of the word line structures and the performance of the memory device are improved.

It should be understood that, although various steps in the flowcharts of FIG. 1, FIG. 2 and FIG. 6 are successively displayed according to the indication of an arrow, those steps are not necessarily implemented according to the order indicated by the arrow. Unless otherwise specified herein, the implementation of those steps is not strictly limited by the order, and those steps may be implemented in other orders. Moreover, at least partial steps of FIG. 1, FIG. 2 and FIG. 6 may include a plurality of sub-steps or a plurality of stages, these sub-steps or stages are not necessarily implemented or completed at the same time, and may be implemented at different times. The implementation order of these sub-steps or stages are not necessarily performed successively, but implemented in turns or alternately with other steps or the sub-steps or stages of other steps.

Each technical feature of the abovementioned embodiments may be combined freely. For simplicity of description, not all possible combinations of each technical solution in the abovementioned embodiments are described. However, any combination of these technical features shall fall within the scope recorded in the specification without conflicting.

The abovementioned embodiments only express some implementation modes of the disclosure and are specifically described in detail and not thus understood as limits to the patent scope of the disclosure. It is to be pointed out that those of ordinary skill in the art may further make a plurality of transformations and improvements without departing from the concept of the disclosure and all of these falls within the protection scope of the disclosure. Therefore, the protection scope of this application should be limited in the appended claims.

The invention claimed is:

1. A method for manufacturing a memory device, comprising:

providing a substrate on which an insulation structure and a plurality of first active structures are formed, the plurality of first active structures being arranged at intervals in the insulation structure;

forming a word line conductive layer on the substrate by a physical vapor deposition process, wherein a top surface of the word line conductive layer is higher than top surfaces of the first active structures;

patterning and etching the word line conductive layer to obtain a plurality of word line structures arranged in parallel and at intervals and filling slots located between adjacent word line structures, wherein the filling slots comprise first filling slots that expose both parts of top surfaces of the first active structures and parts of the top surface of the insulation structure;

forming second active structures that extend from exposed top surfaces of the first active structures to the top surfaces of the word line structures in the first filling slots; and forming isolation structures that extend from exposed top surface of the insulation structure to the top surfaces of the word line structures in the first filling slots.

2. The method of claim 1, wherein a bottom surface, which is located on the top surface of the insulation structure, of the word line conductive layer is lower than the top surfaces of the first active structures, and the operation of providing the substrate comprises:

providing the substrate, on which an insulation layer is formed;

patterning and etching the insulation layer to obtain the insulation structure and a plurality of active trenches arranged at intervals in the insulation structure; and filling the active trenches to form the first active structures of which the top surfaces are higher than the top surface of the insulation structure.

3. The method of claim 2, wherein the active trenches expose an upper surface of the substrate, and wherein the operation of filling the active trenches to form the first active structures of which the top surfaces are higher than the top surface of the insulation structure comprises:

forming the first active structures in the active trenches by an epitaxial process.

4. The method of claim 1, wherein the operation of forming the word line conductive layer on the substrate comprises:

forming a first inter-gate insulation layer on the substrate, wherein the first inter-gate insulation layer covers the top surfaces of the first active structures and the top surface of the insulation structure;

forming a first conductive layer on a top surface of the first inter-gate insulation layer; and forming a second conductive layer on a top surface of the first conductive layer;

wherein the first inter-gate insulation layer, the first conductive layer and the second conductive layer form the word line conductive layer.

5. The method of claim 4, wherein the operation of patterning and etching the word line conductive layer to obtain the plurality of word line structures arranged in parallel and at intervals comprises:

patterning and etching the second conductive layer, the first conductive layer and the first inter-gate insulation layer, to obtain the word line structures each comprising a second conductive structure, a first conductive structure and a first inter-gate insulation structure that are successively superposed.

6. The method of claim 5, wherein the second conductive structure comprises a tungsten conductive structure, the first conductive structure comprises a titanium nitride structure, and the first inter-gate insulation structure comprises a silicon oxide structure.

7. The method of claim 5, further comprising: after the word line structures each comprising the second conductive structure, the first conductive structure and the first inter-gate insulation structure that are successively superposed are obtained,
successively forming a third conductive structure and a second inter-gate insulation structure on side walls of each word line structure;
wherein a extending direction of the third conductive structure and a extending direction of the second inter-gate insulation structure are the same as that of the word line structure, a height of the third conductive structure and a height of the second inter-gate insulation structure are equal to a distance between a bottom surface of the word line structure and a top surface of the word line structure, and a gate word line of the memory device comprises the word line structure, the third conductive structure and the second inter-gate insulation structure.

8. The method of claim 7, wherein the third conductive structure comprises a titanium nitride structure, the second inter-gate insulation structure a silicon oxide structure, the word line structures comprise embedding word line structure, top surfaces of the second active structures and top surfaces of the isolation structures are higher the top surfaces of the word line structures.

9. The method of claim 7, wherein the first inter-gate insulation structure and the second inter-gate insulation structure together form a gate dielectric structure of the memory device.

10. The method of claim 4, wherein the operation of forming the second conductive layer on the first conductive layer comprises:
forming a second conductive layer material on the first conductive layer; and
flattening the second conductive layer material to obtain the second conductive layer.

11. The method of claim 1, wherein the first active structures and the second active structures together form active areas of the memory device, and the isolation structures and the insulation structure together form Slot Trench Isolation (STI) structures between the active areas.

12. The method of claim 1, wherein the filling slots further comprise second filling slots that expose parts of the top surfaces of the first active structures;
while the second active structures that extend from the exposed top surfaces of the first active structures to the top surfaces of the word line structures are formed in the first filling slots, the method further comprises:
forming third active structures that extend from exposed top surfaces of the first active structures to the top surfaces of the word line structures in the second filling slots;
wherein the first active structures, the second active structures and the third active structures together form active areas of the memory device.

13. The method of claim 12, wherein the operation of forming the third active structures that extend from the exposed top surfaces of the first active structures to the top surfaces of the word line structures in the second filling slots comprises:
forming the third active structures that extend from the exposed top surfaces of the first active structures to the top surfaces of the word line structures in the second filling slots by a epitaxial process.

14. The method of claim 1, wherein the operation of forming the second active structures that extend from the exposed top surfaces of the first active structures to the top surfaces of the word line structures in the first filling slots comprises:
forming the second active structures that extend from the exposed top surfaces of the first active structures to the top surfaces of the word line structures in the first filling slots by a epitaxial process.

15. A memory device, comprising:
a substrate;
an insulation structure and a plurality of first active structures located on the substrate, the plurality of first active structures being arranged at intervals in the insulation structure;
a word line conductive layer, located on the substrate, formed through a physical vapor deposition process, wherein a top surface of the word line conductive layer is higher than top surfaces of the plurality of first active structures;
a plurality of word line structures, the plurality of word line structures being formed through patterning and etching the word line conductive layer, the plurality of word line structures being arranged in parallel and at intervals and filling slots located between adjacent word line structures, wherein the filling slots comprise first filling slots that expose both parts of the top surfaces of the plurality of first active structures and parts of a top surface of the insulation structure;
second active structures located in the first filling slots, the second active structures extending from exposed top surfaces of the plurality of first active structures to top surfaces of the plurality of word line structures in the first filling slots; and
isolation structures located in the first filling slots, the isolation structures extending from an exposed top surface of the insulation structure to the top surfaces of the plurality of word line structures in the first filling slots.

16. The memory device of claim 15, wherein a bottom surface, which is located on the top surface of the insulation structure, of a word line structure is lower than the top surfaces of the plurality of first active structures.

17. The memory device of claim 15, wherein each word line structure comprises:
a first inter-gate insulation structure on a first active structure;
a first conductive structure on a top surface of the first inter-gate insulation structure; and
a second conductive structure on a top surface of the first conductive structure.

18. The memory device of claim 17, wherein the second conductive structure comprises a tungsten conductive structure, the first conductive structure comprises a titanium nitride structure, and the first inter-gate insulation structure comprises a silicon oxide structure.

19. The memory device of claim 15, further comprising:
a third conductive structure and a second inter-gate insulation structure on side walls of each word line structure, wherein an extending direction of the third conductive structure and an extending direction of the second inter-gate insulation structure are the same as that of the word line structure, a height of the third conductive structure and a height of the second inter-gate insulation structure are equal to a distance between a bottom surface of the word line structure and a top surface of the word line structure, and a gate word line of the memory device comprises the word line structure, the third conductive structure and the second inter-gate insulation structure.

20. The memory device of claim 15, wherein the filling slots further comprise second filling slots that expose second parts of the top surfaces of the plurality of first active structures, and the memory device further comprises:

third active structures in the second filling slots, the third active structures extend from exposed top surfaces of the plurality of first active structures to the top surfaces of the plurality of word line structures in the second filling slots, wherein the plurality of first active structures, the second active structures and the third active structures together form active areas of the memory device.

* * * * *